(12) United States Patent
Kim

(10) Patent No.: US 10,985,221 B2
(45) Date of Patent: Apr. 20, 2021

(54) DISPLAY DEVICE

(71) Applicant: LG Display Co., Ltd., Seoul (KR)

(72) Inventor: Yonghee Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 16/159,445

(22) Filed: Oct. 12, 2018

(65) Prior Publication Data

US 2019/0165049 A1 May 30, 2019

(30) Foreign Application Priority Data

Nov. 30, 2017 (KR) ........................ 10-2017-0162447

(51) Int. Cl.
*H01L 27/32* (2006.01)
*H01L 51/52* (2006.01)
*H01L 51/00* (2006.01)
*G06F 3/041* (2006.01)
*H01L 23/00* (2006.01)
*H01L 51/56* (2006.01)
*G06F 3/044* (2006.01)
*G06F 3/045* (2006.01)
*G06F 3/042* (2006.01)

(52) U.S. Cl.
CPC .......... *H01L 27/323* (2013.01); *G06F 3/0412* (2013.01); *H01L 23/564* (2013.01); *H01L 27/3244* (2013.01); *H01L 51/0097* (2013.01); *H01L 51/529* (2013.01); *H01L 51/5246* (2013.01); *H01L 51/5253* (2013.01); *H01L 51/5281* (2013.01); *H01L 51/56* (2013.01); *G06F 3/042* (2013.01); *G06F 3/044* (2013.01); *G06F 3/045* (2013.01)

(58) Field of Classification Search
CPC ........ G06F 3/0412; G06F 3/042; G06F 3/044; G06F 3/045; H01L 23/564; H01L 27/323; H01L 27/3244; H01L 51/0097; H01L 51/5246; H01L 51/5253; H01L 51/5281; H01L 51/529; H01L 51/56
See application file for complete search history.

(56) References Cited

U.S. PATENT DOCUMENTS

2015/0102298 A1* 4/2015 Namkung ........... H01L 51/0097
257/40
2016/0005990 A1 1/2016 Lee et al.
(Continued)

FOREIGN PATENT DOCUMENTS

| KR | 10-2016-0004458 | 1/2016 |
| KR | 10-2017-0036875 | 4/2017 |
| KR | 10-2017-0059064 | 5/2017 |

*Primary Examiner* — Stacy Khoo
(74) *Attorney, Agent, or Firm* — Fenwick & West LLP

(57) ABSTRACT

Disclosed is a display device capable of reducing moisture permeation, wherein the display device includes a display module including a display area for displaying an image, a non-display area that does not display the image, and a bending portion in the non-display area, the bending portion of the display module configured to bend, and a polarizing film disposed on the display module including a first recess portion at a first side of the polarizing film, the first recess portion indented away from the first side of the polarizing film towards the display area and non-overlapping with the bending portion of the display module to expose the bending portion of the display module.

14 Claims, 17 Drawing Sheets

(56) References Cited

U.S. PATENT DOCUMENTS

| | | | |
|---|---|---|---|
| 2016/0174304 A1* | 6/2016 | Kim | H01L 51/5253 |
| | | | 313/511 |
| 2017/0080680 A1 | 3/2017 | Lee et al. | |
| 2017/0215288 A1* | 7/2017 | Shi | G09F 9/301 |
| 2018/0011373 A1* | 1/2018 | Zhou | G02F 1/133514 |
| 2019/0050098 A1* | 2/2019 | Koike | G06F 3/042 |

* cited by examiner

DISPLAY DEVICE

CROSS REFERENCE TO RELATED APPLICATIONS

This application claims the benefit of the Republic of Korea Patent Application No. 10-2017-0162447 filed on Nov. 30, 2017, which is hereby incorporated by reference in its entirety.

BACKGROUND

Field of the Disclosure

Embodiments of the present disclosure relate to a display device.

Discussion of the Related Art

With the advancement of an information-oriented society, requirements for a display device of displaying an image are increasing. For example, various display devices such as liquid crystal display (LCD), organic light emitting display (OLED) and quantum dot light emitting display (QLED) have been utilized.

The display device is widely used for electronic devices, for example, smart phone, tablet, notebook computer, monitor, television, and etc. Recently, with the advancement of a mobile communication technology, the use of portable electronic devices such as smart phone, tablet and notebook computer has been increased largely. The portable electronic device is used while a user is moving, whereby the portable electronic device is apt to be exposed to external environments such as moisture. In this reason, a waterproofing performance is one of the most important requirements for the portable electronic device.

The portable electronic device includes a plurality of plastic material layers, wherein the plurality of plastic material layers are adhered to each other by the use of adhesive layer. In this case, a step difference may be caused by a gap generated for a process of adhering the plurality of plastic material layers. Through the gap between the plastic material layers, moisture may permeate into the display device, which might reduce a lifespan of the display device, or cause driving defects of the display device.

SUMMARY

Accordingly, embodiments of the present disclosure are directed to a display device that substantially obviates one or more problems due to limitations and disadvantages of the related art, and a display apparatus comprising the same.

An aspect of embodiments of the present disclosure is directed to provide a display device which facilitates to reduce moisture permeation.

Another aspect of embodiments of the present disclosure is directed to provide a display device in which an end of a polarizing film is identical to an end of a display module in a non-bending area so as to remove a step difference there between.

Another aspect of embodiments of the present disclosure is directed to provide a display device in which an end of an adhesion layer is identical to an end of a polarizing film in a non-bending area so as to remove a step difference there between.

Another aspect of embodiments of the present disclosure is directed to provide a display device in which an end of each of a polarizing film, a touch film and a reinforcement layer is identical to an end of a display module so as to remove a step difference there among.

A further aspect of embodiments of the present disclosure is directed to provide a display device which includes a reinforcement layer capable of preventing cracks in a display module for a bending process.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided a display device that may include a display module including a display area for displaying an image, a non-display area that does not display the image, and a bending portion configured to bend, wherein the bending portion includes a bending area in the non-display area, and a polarizing film disposed on the display module, the polarizing film including a first recess portion at a first side of the polarizing film, the first recess portion indented away from the first side of the polarizing film towards the display area and non-overlapping with the bending portion of the display module to expose the bending portion of the display module.

In another aspect of an embodiment of the present disclosure, there is provided a display device that may include a display module including a display area for displaying an image, a non-display area, and a bending portion at a side of the display module, the bending portion of the display module, and a polarizing film disposed on the display module and configured to expose the bending portion of the display module, the polarizing film comprising a plurality of sides that are each aligned with a corresponding side of the display module except for the side of the display module that includes the bending portion.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
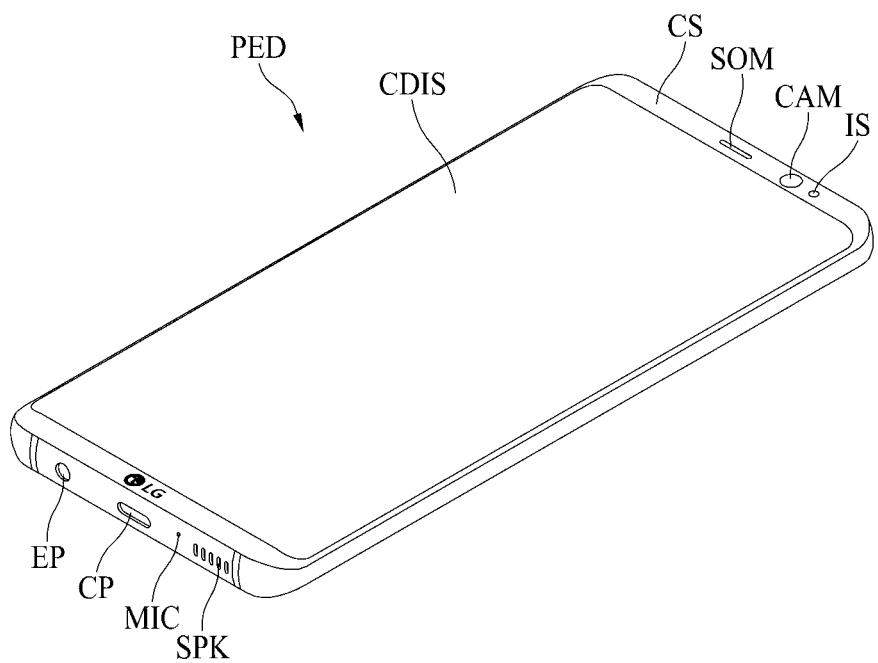
FIG. 1 is a perspective view illustrating a portable electronic device having a display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction" may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to the embodiment of the present disclosure will be described in detail with reference to the accompanying drawings.

FIG. 1 is a perspective view illustrating a portable electronic device having a display device according to one embodiment of the present disclosure.

Referring to FIG. 1, the portable electronic device (PED) according to one embodiment of the present disclosure is a smart phone, but not limited thereto. That is, the portable electronic device (PED) according to one embodiment of the present disclosure may be a tablet or a notebook computer.

The portable electronic device (PED) may include a case (CS) corresponding to the exterior, a display device (CDIS), a sound output module (SOM), an image sensor (CAM), an illumination sensor (IS), a speaker (SPK), a microphone (MIC), an earphone port (EP) and a charging port (CP).

The case (CS) may be provided to cover front, lateral and rear surfaces of the portable electronic device (PED). The case (CS) may be formed of a plastic material. The display device (CDIS), the sound output module (SOM), the camera (CAM) and the illumination sensor (IS) may be disposed in the front surface of the case (CS). The microphone (MIC), the earphone port (EP) and the charging portion (CP) may be disposed at one lateral surface of the case (CS).

The display device (CDIS) occupies most of the front surface of the portable electronic device (PED). The display device (CDIS) will be described in detail later.

The sound output module (SOM) is a receiving set for outputting a voice of an opposite user for a phone call. The image sensor (CAM) is a set for videoing an image in the front surface of the portable electronic device (PED), wherein another image sensor may be additionally in the rear surface of the portable electronic device (PED). The illumination sensor (IS) senses an amount of incident light, and adjusts a brightness of the display device (CDIS). The microphone (MIC) is a transmitting set for converting a sound wave of a user voice into an electrical signal, and transmitting the electrical signal. The speaker (SPK) outputs a sound wave signal related with an application or function performed in the portable electronic device (PED). If using an earphone, the earphone port (EP) is a port for outputting the sound wave signal to the earphone instead of the speaker (SPK). The charging port (CP) is a port to which a charger for charging a battery of the portable electronic device (PED) is connected.

First Embodiment

Figure 2:
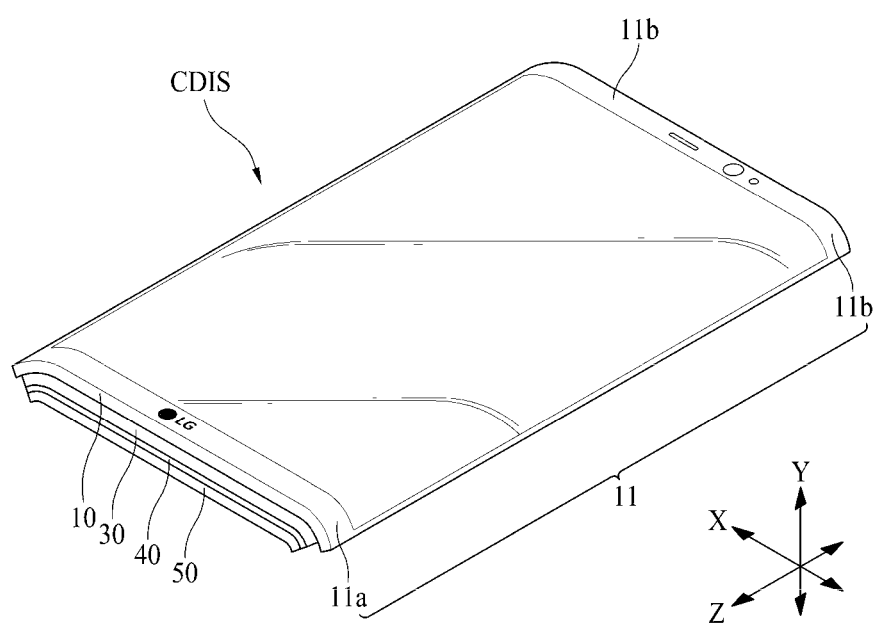
FIG. 2 is a perspective view illustrating a display device according to a first embodiment of the present disclosure.

FIG. 2 is a perspective view illustrating a display device according to a first embodiment of the present disclosure.

Referring to FIG. 2, the display device according to the first embodiment of the present disclosure may include a cover substrate 10, a polarizing film 30, a display module 40 and a heat-dissipation film 50.

The cover substrate 10 may be formed of plastic or glass. The cover substrate 10 may include a flat portion and a curvature portion. The flat portion may be formed in a central area of the cover substrate 10, and the curvature portion may be formed with a first curvature in at least one edge of the cover substrate 10. In FIGS. 1 and 2, the curvature portion is formed at both edge of the cover substrate 10, but not limited thereto. That is, the curvature portion may be formed in one edge of the cover substrate 10, three edges of the cover substrate 10, or four edges of the cover substrate 10. In FIG. 2, the cover substrate 10 includes the curvature portion, but not necessarily. The cover substrate 10 may include only the flat portion.

A deco layer 11 may be formed in the rear surface of the cover substrate 10 confronting the display module 40. The deco layer 11 may be a layer for showing a predetermined pattern to a user when an image is not displayed on the display module 40. For example, as shown in FIG. 2, a company logo such as "LG" 11a may be formed in the deco layer 11. Also, the deco layer 11 may include a color layer 11b formed in an area corresponding to a bezel area. For example, the deco layer 11 may include the color layer 11b having a black color corresponding to the bezel area of the display module 40. In this case, the color layer 11b of the deco layer 11 may be expressed as the color which is the same as that of a display area of the display module 40 when an image is not displayed on the display module 40. Thus, a screen of the display module 40 may seem large to a user.

The polarizing film 30 is disposed in the rear surface of the cover substrate 10. The polarizing film 30 prevents lowering of visibility by a reflection of external light.

Figure 8:
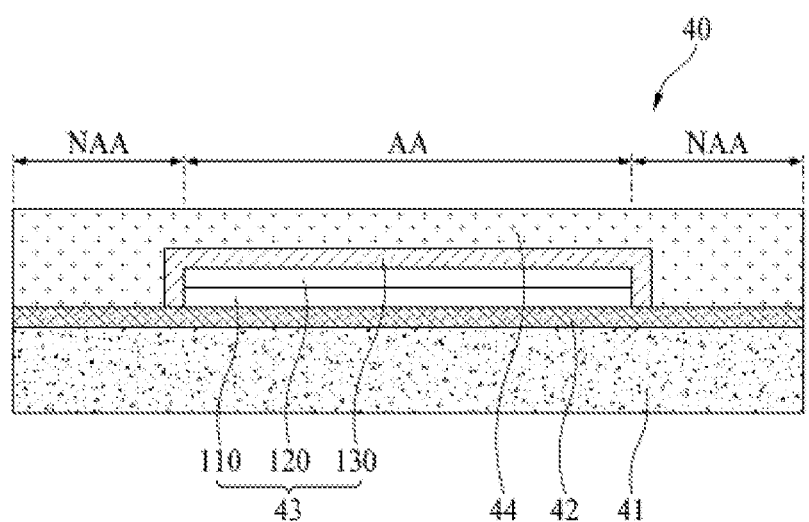
FIG. 8 is a cross sectional view illustrating one embodiment of a display module shown in FIG. 3, according to the first embodiment of the present disclosure.
Figure 9:
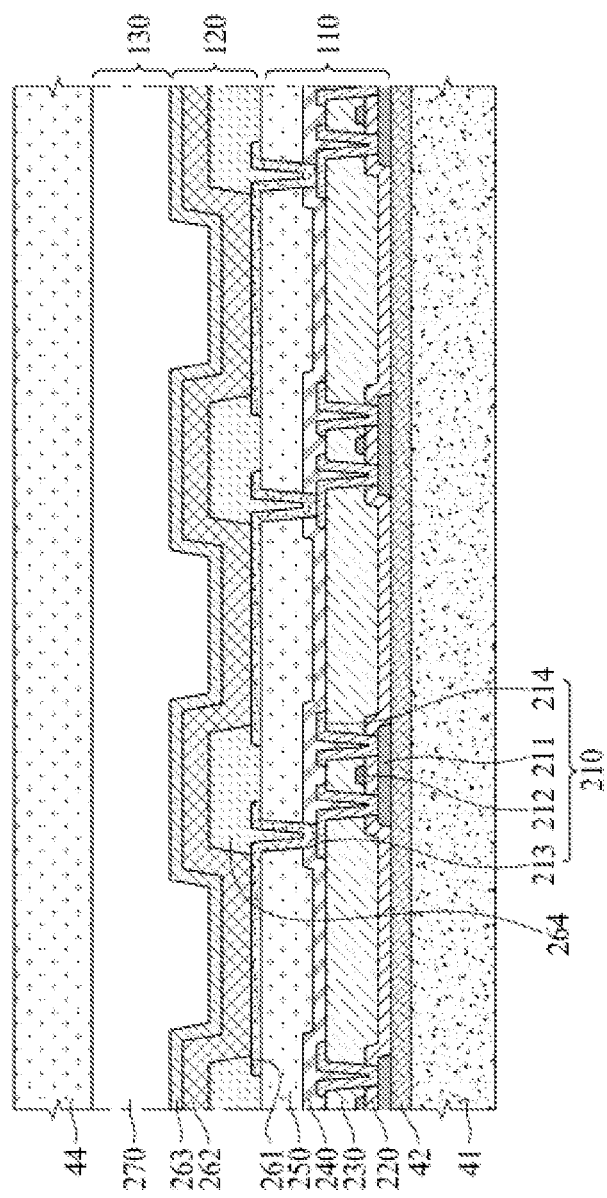
FIG. 9 is a detailed cross sectional view illustrating a display area of a display module shown in FIG. 8, according to the first embodiment of the present disclosure.

The display module 40 may be disposed in the rear surface of the polarizing film 30. The display module 40 is a display device for displaying a predetermined image. For example, the display module 40 may be an organic light emitting display, as shown in FIGS. 8 and 9, but not limited to this type. That is, the display module 40 may be an electroluminescence display such as a quantum dot light emitting display.

The display module 40 may be disposed on the flat portion and the curvature portion of the cover substrate 10. According as the display module 40 is disposed on the curvature portion (CU) of the cover substrate 10, a user can watch an image through the curvature portion (CU) of the cover substrate 10.

The heat-dissipation film 50 may be disposed in the rear surface of the display module 40. The heat-dissipation film 50 may include a material with high thermal conductivity so as to dissipate heat generated in the display module 40. Also, the heat-dissipation film 50 may function as a shock absorber for protecting the display module 40 from an external shock.

Hereinafter, the polarizing film and the display module according to the first embodiment of the present disclosure will be described in detail with reference to FIGS. 3 to 9.

Figure 3:
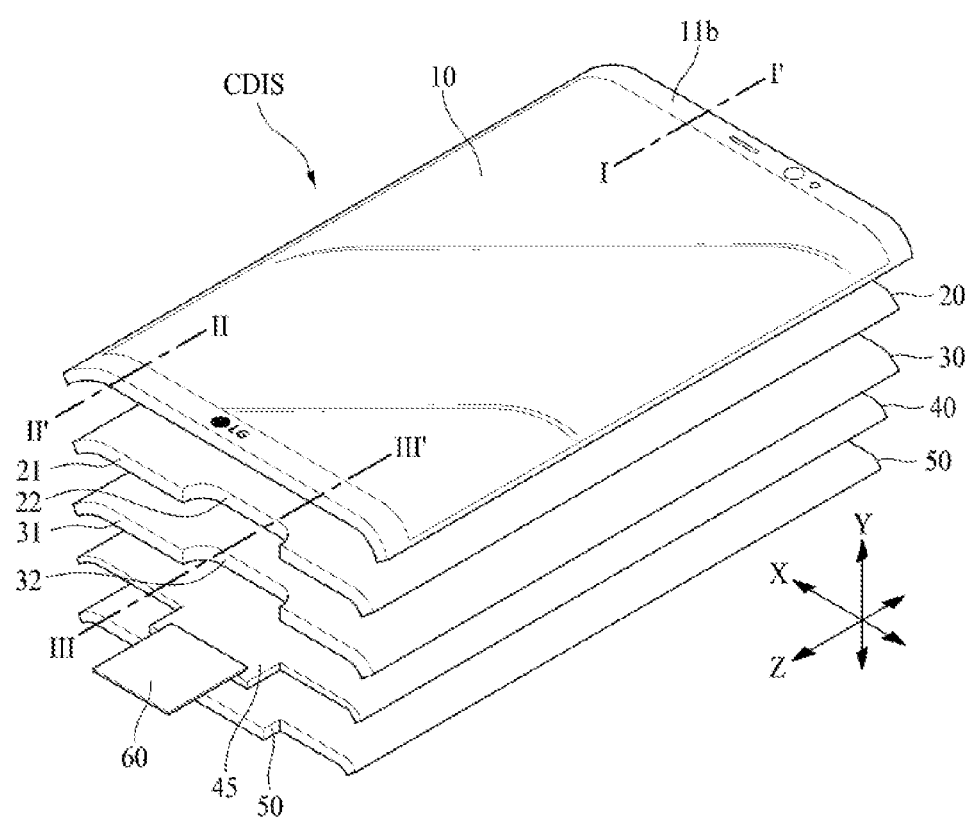
FIG. 3 is an exploded perspective view illustrating the display device according to the first embodiment of the present disclosure.
Figure 4:
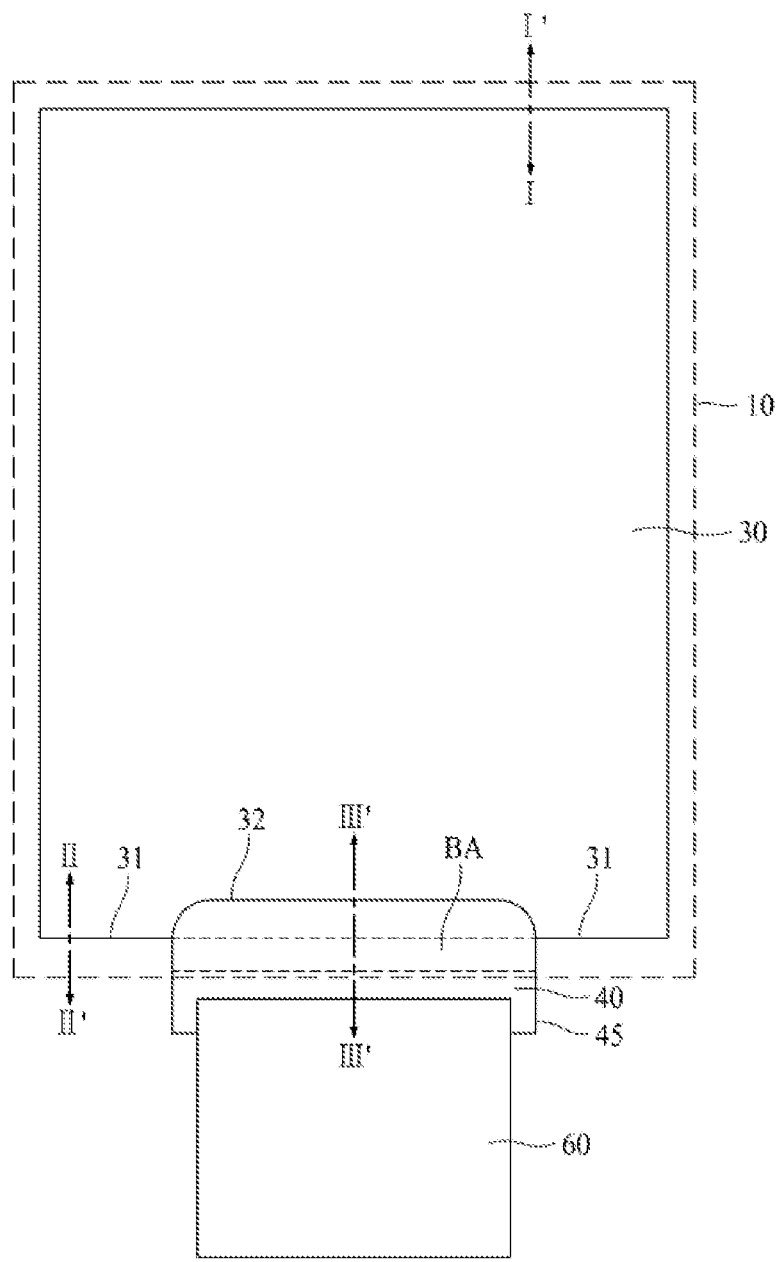
FIG. 4 is a plane view illustrating a polarizing film and a display module according to the first embodiment of the present disclosure.
Figure 5:
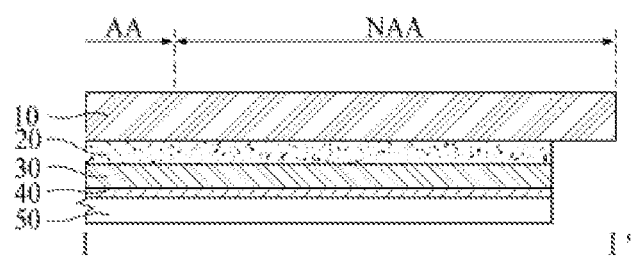
FIG. 5 is a cross sectional view along I-I' of FIG. 4, according to the first embodiment of the present disclosure.
Figure 6:
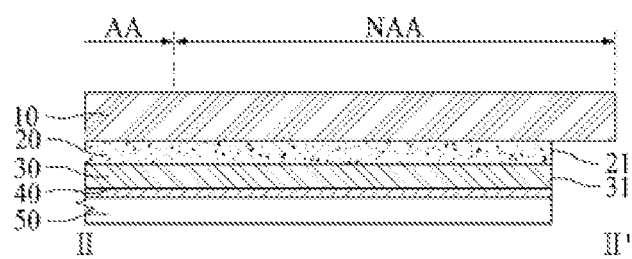
FIG. 6 is a cross sectional view along II-II' of FIG. 4, according to the first embodiment of the present disclosure.
Figure 7A:
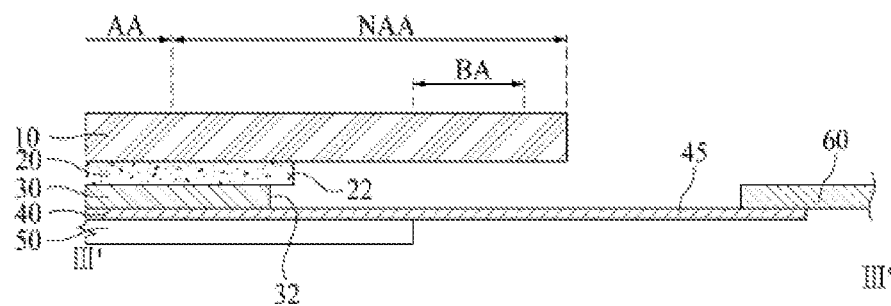
FIG. 7A is a cross sectional view along of FIG. 4, according to the first embodiment of the present disclosure.
Figure 7B:
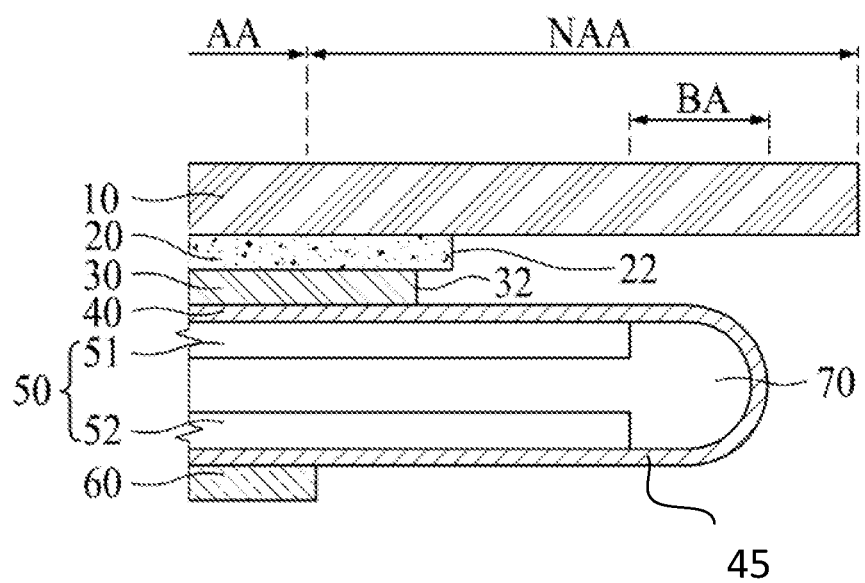
FIG. 7B is a cross sectional view illustrating a bending shape of FIG. 7A, according to the first embodiment of the present disclosure.

FIG. 3 is an exploded perspective view illustrating the display device according to the first embodiment of the present disclosure. FIG. 4 is a plane view illustrating the polarizing film and the display module according to the first embodiment of the present disclosure. FIG. 5 is a cross sectional view along I-I' of FIG. 4 according to the first embodiment of the present disclosure. FIG. 6 is a cross sectional view along II-IP of FIG. 4 according to the first embodiment of the present disclosure. FIG. 7A is a cross sectional view along of FIG. 4 according to the first embodiment of the present disclosure. FIG. 7B is a cross sectional view illustrating a bending shape of FIG. 7A according to the first embodiment of the present disclosure. FIG. 8 is a cross sectional view illustrating one embodiment of the display module shown in FIG. 3 according to the first embodiment of the present disclosure. FIG. 9 is a detailed cross sectional view illustrating the display area of the display module shown in FIG. 8 according to the first embodiment of the present disclosure.

Referring to FIGS. 3 to 9, the display device according to the first embodiment of the present disclosure may further an adhesion layer 20 as well as the cover substrate 10, the polarizing film 30, the display module 40 and the heat-dissipation film 50.

The heat-dissipation film 50 may include a cushion layer, a heat-dissipation layer and an electrostatic protection layer. The cushion layer may be disposed on the rear surface of the display module 40. The cushion layer may absorb an external shock applied to the display module 40. An adhesion material may be coated onto the front surface of the cushion layer, whereby the heat-dissipation film 50 may be adhered onto the rear surface of the display module 40 without an additional adhesion layer.

The heat-dissipation layer may be disposed on the rear surface. The heat-dissipation layer may be formed of a metal layer with high thermal conductivity so as to dissipate heat generated from the display module 40, for example, graphite.

The electrostatic protection layer may be disposed on the rear surface. The electrostatic protection layer may protect the display module 40 from externally-applied static electricity, and the electrostatic protection layer together with the heat-dissipation layer may dissipate heat generated from the display module 40. The electrostatic protection layer may be formed of copper (Cu).

The display module 40 is disposed on the heat-dissipation film 50. As shown in FIGS. 8 and 9, the display module 40 may include a support substrate 41, a flexible substrate 42, a pixel array layer 43 and a barrier film 44. The pixel array layer 43 may include a thin film transistor layer 110, an emission device layer 120 and an encapsulation layer 130. The display area (AA) indicates the area provided with the emission device layer 120 and configured to display an image, and the non-display area (NAA) indicates the peripheral area of the display area (AA).

The support substrate 41 supports the flexible substrate 42, and the support substrate 41 may be formed of plastic. For example, the support substrate 41 may be formed of polyethylene terephthalate (PET).

The flexible substrate 42 may be disposed on the front surface of the support substrate 41. The flexible substrate 42 may be formed of a plastic film with flexibility. For example, the flexible substrate 42 may be formed of a polyimide film.

The pixel array layer 43 may be formed on the front surface of the flexible substrate 42. The pixel array layer 43 corresponds to the layer for displaying an image by the use of a plurality of pixels. The pixel array layer 43 may include the thin film transistor layer 110, the emission device layer 120 and the encapsulation layer 130.

The thin film transistor layer 110 is formed on the flexible substrate 42. The thin film transistor layer 110 may include thin film transistors 210, a gate insulating film 220, an insulating interlayer 230, a protection layer 240 and a planarization film 250.

A buffer film may be formed on the flexible substrate 42. The buffer film may be formed on the flexible substrate 42 so as to protect the thin film transistors 210 and emission devices from a moisture permeation, wherein moisture may permeate through the support substrate 41 and the flexible substrate 42 which are vulnerable to moisture. The buffer film may be formed of a plurality of inorganic films deposited alternately. For example, the buffer film may be formed in a single-layered structure of silicon oxide film (SiOx), silicon nitride film (SiNx) or silicon nitride oxide (SiON), or a multi-layered structure of silicon oxide film (SiOx), silicon nitride film (SiNx) and silicon nitride oxide (SiON). According to the structure and properties of the thin film transistor 210, it is possible to omit the buffer film.

The thin film transistor 210 is formed on the buffer film. The thin film transistor 210 may include an active layer 211, a gate electrode 212, a source electrode 213 and a drain electrode 214. FIG. 9 shows a top gate method where the gate electrode 212 of the thin film transistor 210 is disposed above the active layer 211, but not limited to the top gate method. For example, the thin film transistor 210 may be formed in a bottom gate method where the gate electrode 212 is disposed below the active layer 211, or a double gate method where the gate electrode 212 is disposed both above and below the active layer 211.

The active layer 211 is formed on the buffer film. The active layer 211 may be formed of a silicon-based semiconductor material or an oxide-based semiconductor material. Between the buffer film and the active layer 211, there is a light shielding layer for shielding ambient light which is incident on the active layer 211.

The gate insulating film 220 may be formed on the active layer 211. For example, the gate insulating film 220 may be formed in a single-layered structure of silicon oxide film (SiOx) or silicon nitride film (SiNx), or a multi-layered structure of silicon oxide film (SiOx) and silicon nitride film (SiNx).

The gate electrode 212 and a gate line may be formed on the gate insulating film 220. The gate electrode 212 and the gate line may be formed in a single-layered structure of any one selected among molybdenum (Mo), aluminum (Al), chrome (Cr), *aurum* (Au), titanium (Ti), nickel (Ni), neodymium (Nd), copper (Cu), and their alloys, or may be formed in a multi-layered structure of materials selected among molybdenum (Mo), aluminum (Al), chrome (Cr), *aurum* (Au), titanium (Ti), nickel (Ni), neodymium (Nd), copper (Cu), and their alloys.

The insulating interlayer 230 may be formed on the gate electrode 212 and the gate line. For example, the insulating interlayer 230 may be formed in a single-layered structure of silicon oxide film (SiOx) or silicon nitride film (SiNx), or a multi-layered structure of silicon oxide film (SiOx) and silicon nitride film (SiNx).

The source electrode 213, the drain electrode 214 and a data line may be formed on the insulating interlayer 230. Each of the source electrode 213 and the drain electrode 214 may be connected with the active layer 211 via a contact hole penetrating through the gate insulating film 220 and the insulating interlayer 230. The source electrode 213, the drain electrode 214 and the data line may be formed in a single-layered structure of any one selected among molybdenum (Mo), aluminum (Al), chrome (Cr), *aurum* (Au), titanium (Ti), nickel (Ni), neodymium (Nd), copper (Cu), and their alloys, or may be formed in a multi-layered structure of materials selected among molybdenum (Mo), aluminum (Al), chrome (Cr), *aurum* (Au), titanium (Ti), nickel (Ni), neodymium (Nd), copper (Cu), and their alloys.

The protection film 240 may be formed on the source electrode 213, the drain electrode 214 and the data line, and the protection film 240 may be provided to insulate the thin film transistor 210. The protection film 240 may be formed in a single-layered structure of silicon oxide film (SiOx) or silicon nitride film (SiNx), or a multi-layered structure of silicon oxide film (SiOx) and silicon nitride film (SiNx).

The planarization film 250 may be formed on the protection film 240 so as to compensate for a step difference caused by the thin film transistor 210. The planarization film 250 may be formed of an organic film such as acryl resin, epoxy resin, phenolic resin, polyamide resin, or polyimide resin.

The emission device layer 120 is formed on the thin film transistor layer 110. The emission device layer 120 may include the emission devices and a bank 264.

The emission devices and the bank 264 are formed on the planarization film 250. The emission device may be an organic light emitting device. In this case, the emission device may include a first electrode 261, an emission layer 262 and a second electrode 263. The first electrode 261 is an anode electrode, and the second electrode 263 is a cathode electrode.

The first electrode 261 may be formed on the planarization film 250. The first electrode 261 may be connected with the source electrode 213 of the thin film transistor 210 via a contact hole penetrating through the protection film 240 and the planarization film 250. The first electrode 261 may be formed of a metal material with high reflectance, for example, a deposition structure (Ti/Al/Ti) of aluminum and titanium, a deposition structure (ITO/Al/ITO) of aluminum and ITO, a deposition structure (ITO/Ag/ITO) of argentums and ITO, APC alloy, or a deposition structure (ITO/APC/ITO) of APC alloy and ITO. Herein, the APC ally corresponds to the alloy of argentums (Ag), palladium (Pd) and copper (Cu).

The bank 264 is formed to cover the edge of the first electrode 261 on the planarization film 250 so as to divide the pixels. That is, the bank 264 functions as a pixel defining film so as to define the pixels.

Each pixel may form an emission area obtained by sequentially depositing the first electrode 261 corresponding to the anode electrode, the emission layer 262, and the second electrode 263 corresponding to the cathode electrode, wherein a hole provided from the first electrode 261 and an electron provided from the second electrode 263 are bonded to each other in the emission area so as to emit light.

The emission layer 262 is formed on the first electrode 261 and the bank 264. The emission layer 262 may be an organic light emitting layer. In this case, the emission layer 262 may be a common layer formed for the pixels in common, which may be a white light emitting layer for emitting white light. The emission layer 262 may be formed in a tandem structure including at least two stacks. Each stack may include a hole transporting layer, at least one light emitting layer and an electron transporting layer.

If the emission layer 262 is formed in the tandem structure including at least two stacks, a charge generating layer may be formed between the stacks. The charge generating layer may include an n-type charge generating layer positioned adjacent to a lower stack, and a p-type charge generating layer provided on the n-type charge generating layer and positioned adjacent to an upper stack. The n-type charge generating layer injects the electron to the lower stack, and the p-type charge generating layer injects the hole to the upper stack. The n-type charge generating layer may be formed by doping an organic host material having an electron transporting capacity with alkali-based metal such as lithium (Li), natrium (Na), kalium (K) or cesium (Cs), or alkali earth metal such as magnesium (Mg), strontium (Sr), barium (Ba) or radium (Ra), but not limited to these materials. The P-type charge generating layer may be formed by doping an organic host material having a hole transporting capacity with dopant.

The second electrode 263 is formed on the emission layer 262. The second electrode 263 may cover the emission layer 262. The second electrode 263 may be a common layer for the pixels in common.

The second electrode 263 may be formed of a transparent conductive material (TCO) such as ITO or IZO capable of transmitting light therethrough, or a semi-transmissive conductive material such as magnesium (Mg), argentums (Ag) or alloy of magnesium (Mg) and argentums (Ag). If the second electrode 263 is formed of the semi-transmissive conductive material, it is possible to improve a light emission efficiency by a micro cavity. A capping layer may be additionally disposed on the second electrode 263.

The encapsulation layer 130 is formed on the emission device layer 120. The encapsulation layer 130 may include an encapsulation film 270.

The encapsulation film 270 prevents moisture or oxygen from being permeated into the emission layer 262 and the second electrode 263. To this end, the encapsulation film 270 may include at least one inorganic film. The inorganic film may be formed of silicon nitride, aluminum nitride, zirconium nitride, titanium nitride, hafnium nitride, tantalum nitride, silicon oxide, aluminum oxide or titanium oxide.

Also, the encapsulation film 270 may further include at least one organic film. The organic film may be formed at a thickness sufficient for preventing particles from being permeated into the emission layer 262 and the second electrode 263 through the encapsulation film 270.

A color filter layer may be formed on the encapsulation layer 130. The color filter layer includes color filters and black matrix. Each color filter may be disposed in each pixel. The black matrix may be disposed between each of the pixels so as to prevent light of any one pixel from traveling toward the adjacent pixel and being mixed with light of the adjacent pixel. The black matrix may be disposed while being overlapped with the bank 264. An overcoat layer may be provided on the color filters so as to compensate for a step difference caused by the color filters and the black matrix.

A barrier film 44 may be disposed to cover the pixel array layer 43 so as to protect the pixel array layer 43 from moisture or oxygen. That is, the barrier film 44 may be disposed on the pixel array layer 43.

The display module 40 may include the display area (AA) and the non-display area (NAA). The non-display area (NAA) corresponds to the peripheral area of the display area (AA), wherein the non-display area (NAA) may be disposed to surround the upper, left, right and lower sides of the display area (AA). The non-display area (NAA) may include a bending area (BA) disposed in at least one among the upper, left, right and lower sides.

The display module 40 may include a bending portion 45 formed in at least one among the upper, left, right and lower sides. The bending portion 45 is obtained by attaching a source drive IC, which protrudes from one side of the flexible substrate 42, for example, a lower side of the flexible substrate 42, to a flexible film 60 in a chip on film (COF) or chip on plastic (COP) method. As shown in FIG. 7B, the bending portion 45 may include the bending area (BA) so as to dispose the flexible film 60 on the rear surface of the heat-dissipation film 50. FIG. 7B shows one embodiment of a bending shape. Referring to FIG. 7B, the bending portion 45 of the display module 40 is disposed on a first heat-dissipation film 51, and one end of the bending portion 45 is attached to the flexible film 60. The bending portion 45 of the display module 40 may be bent to the rear surface of a second heat-dissipation film 52 along a guide member 70 for guiding the flexible film 60 to the rear surface of the second heat-dissipation film 52.

In FIGS. 3 and 4, the bending portion 45 is formed at the lower side of the display module 40, but not limited to this structure. For convenience of explanation, it is assumed that the bending portion 45 is formed at the lower side of the display module 40.

A polarizing film 30 is disposed on the display module 40. The polarizing film 30 is disposed while being overlapped with some area of the display module 40. In detail, the polarizing film 30 is overlapped with the display area (AA) of the display module 40, to thereby prevent lowering of visibility caused by a reflection of ambient light. The polarizing film 30 is disposed while being overlapped with the display module 40 in the non-display area (NAA) of the remaining sides of the display module 40 except the side with the bending portion 45 of the display module 40. The polarizing film 30 may be disposed while being not overlapped with the bending portion 45 of the display module 40.

The end of the polarizing film 30 may be identical to the end of the display module 40 in the non-display area (NAA) of the remaining sides except the side with the bending portion 45 of the display module 40. For example, as shown in FIG. 5, the end of the polarizing film 30 may be identical to the end of the display module 40 in the left, right and upper sides of the display module 40.

Meanwhile, the polarizing film 30 may include a first protruding portion 31 (e.g., a first edge) and a first recess portion 32 disposed at the lower side, that is, the side with the bending portion 45 of the display module 40. The first recess portion 32 exposes the bending portion 45 of the display module 40, and the first recess portion 32 is provided at a first distance from the bending portion 45 of the display module 40. The first protruding portion 31 may protrude so as to cover the display module 40 under the circumstances that the first recess portion 32 is provided in-between. The end of the polarizing film 30 may be identical to the end of the display module 40 in the first protruding portion 31. Meanwhile, the end of the polarizing film 30 may be not identical to the end of the display module 40 in the first recess portion 32.

The bending portion 45 of the display module 40 may protrude downwardly from the display module 40, and the bending portion 45 protruding from the display module 40 may be disposed in the area corresponding to the first recess portion 32 of the polarizing film 30.

The first protruding portion 31 of the polarizing film 30 is formed on the display module 40, and the first protruding portion 31 of the polarizing film 30 and the display module 40 are cut at the same time by the use of laser, whereby the end of the polarizing film 30 may be identical to the end of the display module 40.

The adhesion layer 20 is disposed between the cover substrate 10 and the polarizing film 30, whereby the cover substrate 10 and the polarizing film 30 are adhered to each other by the use of adhesion layer 20. The adhesion layer 20 may be optically transparent resin (OCR) or optically transparent adhesive film (OCA film).

The adhesion layer 20 is disposed on the polarizing film 30. The adhesion layer 20 may be disposed while being overlapped with the polarizing film 30. The adhesion layer 20 may be disposed while being overlapped with some area of the display module 40 together with the polarizing film 30. In more detail, the adhesion layer 20 may be disposed while being overlapped with the display module 40 in the non-display area (NAA) of the remaining sides except the side with the bending portion 45 of the display module 40. The adhesion layer 20 may be disposed while being not overlapped with the bending portion 45 of the display module 40.

The end of the adhesion layer 20 may be identical to the end of the display module 40 in the non-display area (NAA) of the remaining sides except the side with the bending portion 45 of the display module 40. For example, as shown in FIG. 5, the end of the adhesion layer 20 may be identical to the end of the display module 40 in the left, right and upper sides of the display module 40 at which the bending portion 45 is not formed.

Also, as shown in FIG. 5, the end of the adhesion layer 20 may be identical to the end of the display module 40 in a non-bending area (NBA) except the bending area (BA) at the lower side of the display module 40 with the bending portion 45.

Meanwhile, the adhesion layer 20 may include a second protruding portion 21 (e.g., a second edge) and a second recess portion 22 disposed at the lower side, that is, the side with the bending portion 45 of the display module 40. The second recess portion 22 exposes the bending portion 45 of the display module 40, and the second recess portion 22 is provided at a second distance from the bending portion 45 of the display module 40. The second protruding portion 21 may protrude so as to cover the display module 40 under the circumstances that the second recess portion 22 is provided in-between. The end of the adhesion layer 20 may be identical to the end of the polarizing film 30 and the display module 40 in the second protruding portion 21. Meanwhile, the end of the adhesion layer 20 may be identical to the end of the polarizing film 30 in the second recess portion 22, but not identical to the end of the display module 40 in the second recess portion 22.

The display device according to the first embodiment of the present disclosure may be embodied in that the end of the polarizing film 30 is identical to the end of the display module 40 in the non-display area (NAA) at the side which is not provided with the bending portion 45. In the display device according to the first embodiment of the present disclosure, the polarizing film 30 and the display module 40 are cut at the same time by the use of laser, whereby the end of the polarizing film 30 is identical to the end of the display module 40. Accordingly, it is possible to remove the step difference between the polarizing film 30 and the display module 40, and to prevent moisture permeation.

Also, the display device according to the first embodiment of the present disclosure may be embodied in that the end of the adhesion layer 20 is identical to the end of the polarizing film 30 in the non-display area (NAA) at the side which is not provided with the bending portion 45. Accordingly, it is possible to remove the step difference between the adhesion layer 20 and the polarizing film 30, and to prevent moisture permeation.

Also, the display device according to the first embodiment of the present disclosure is embodied in that the first protruding portion 31 and the first recess portion 32 are formed at the lower side of the polarizing film 30, and the end of the polarizing film 30 is identical to the end of the display module 40 in the first protruding portion 31. In one embodiment, the polarizing film 30 is not formed above the bending portion 45 at which the stress is generated for the bending process. The polarizing film 30 may be smaller than the display module 40 so as to expose the bending portion 45. In this case, the step difference may be generated between the polarizing film 30 and the display module 40, and moisture may permeate through the step difference. In this case, the step difference may be generated in the non-display area (NAA) where the bending portion 45 is not formed at the lower side of the display module 40. In this display device according to the first embodiment of the present disclosure, the first protruding portion 31 is formed in the area under which the bending portion 45 is not provided, and the end of the polarizing film 30 is identical to the end of the display module 40 in the first protruding portion 31. Accordingly, it is possible to reduce the area with the step difference between the polarizing film 30 and the display module 40 at the lower side provided with the bending portion 45, whereby it is possible to prevent moisture permeation.

Also, the display device according to the first embodiment of the present disclosure is embodied in that the second protruding portion 21 and the second recess portion 22 are formed at the lower side of the adhesion layer 20, and the end of the adhesion layer 20 is identical to the end of the polarizing film 30 and the display module 40 in the second protruding portion 21. In one embodiment, the adhesion layer 20 is not formed above the bending portion 45 at which the stress is generated for the bending process. The adhesion layer 20 may be smaller than the display module 40 so as to expose the bending portion 45. In this case, the step difference may be generated between the adhesion layer 20 and the polarizing film 30/the display module 40, and moisture may permeate through the step difference. In this case, the step difference may be generated in the non-display area (NAA) where the bending portion 45 is not formed at the lower side of the display module 40. In this display device according to the first embodiment of the present disclosure, the second protruding portion 21 is formed in the area under which the bending portion 45 is not provided, and the end of the adhesion layer 20 is identical to the end of the polarizing film 30 and the display module 40 in the second protruding portion 21. Accordingly, it is possible to reduce the area with the step difference between the adhesion layer 20 and the polarizing film 30/the display module 40 at the lower side of the display module 40 provided with the bending portion 45, whereby it is possible to prevent moisture permeation.

Second Embodiment

Figure 10:
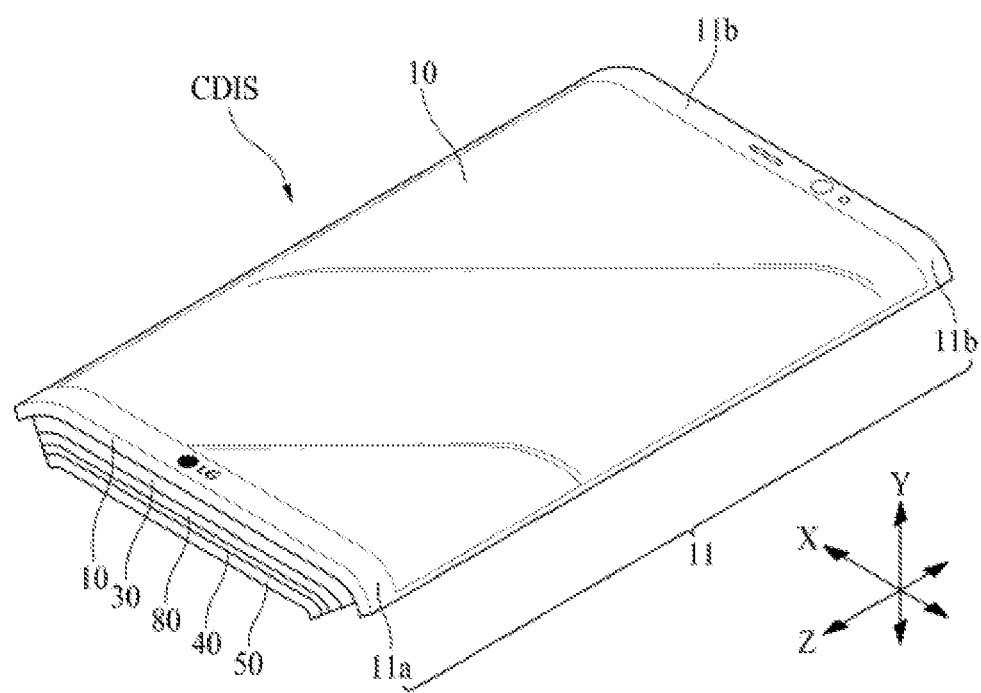
FIG. 10 is a perspective view illustrating a display device according to a second embodiment of the present disclosure.

FIG. 10 is a perspective view illustrating a display device according to a second embodiment of the present disclosure.

Referring to FIG. 10, the display device according to the second embodiment of the present disclosure may include a cover substrate 10, a touch film 80, a polarizing film 30, a display module 40 and a heat-dissipation film 50. The cover substrate 10, the polarizing film 30, the display module 40 and the heat-dissipation film 50 shown in FIG. 10 are the same as those shown in FIG. 2, whereby a detailed description for the cover substrate 10, the touch film 80, the polarizing film 30, the display module 40 and the heat-dissipation film 50 shown in FIG. 10 will be omitted.

The polarizing film 30 is disposed in the rear surface of the cover substrate 10. The polarizing film 30 prevents lowering of visibility by a reflection of ambient light.

The touch film 80 is disposed in the rear surface of the polarizing film 30. The touch film 80 may be formed in a capacitive type, a resistive type or an optical type.

According to one embodiment of the present disclosure, if a user touches the cover substrate 10, the touch film 80 may be a resistive type touch film which senses a user's touch pressure.

If the touch film 80 is the resistive type touch film, lower and upper substrates are combined with each other, and dot spaces for maintaining a predetermined interval between the lower and upper substrates are provided at fixed intervals on the lower substrate. Each of the lower and upper substrates may be formed of an insulating substrate (plastic film, glass, and etc.) Also, the lower and upper substrates may be bonded to each other by the use of insulating adhesive such as double-sided tape. Herein, an X-axis electrode is formed on one surface of the upper substrate confronting the lower substrate, and a Y-axis electrode is formed on one surface of the lower substrate confronting the upper substrate.

If a physical force is applied to an upper surface of the touch film 80, the X-axis electrode of the upper substrate is in contact with the Y-axis electrode of the lower substrate, whereby a touch point is sensed by sensing X-axis and Y-axis potential of the corresponding contact point.

The display module 40 is disposed in the rear surface of the touch film 80. The heat-dissipation film 50 is disposed in the rear surface of the display module 40.

Hereinafter, the polarizing film, the touch film and the display module according to the second embodiment of the present disclosure will be described with reference to FIGS. 11 to 15.

Figure 11:
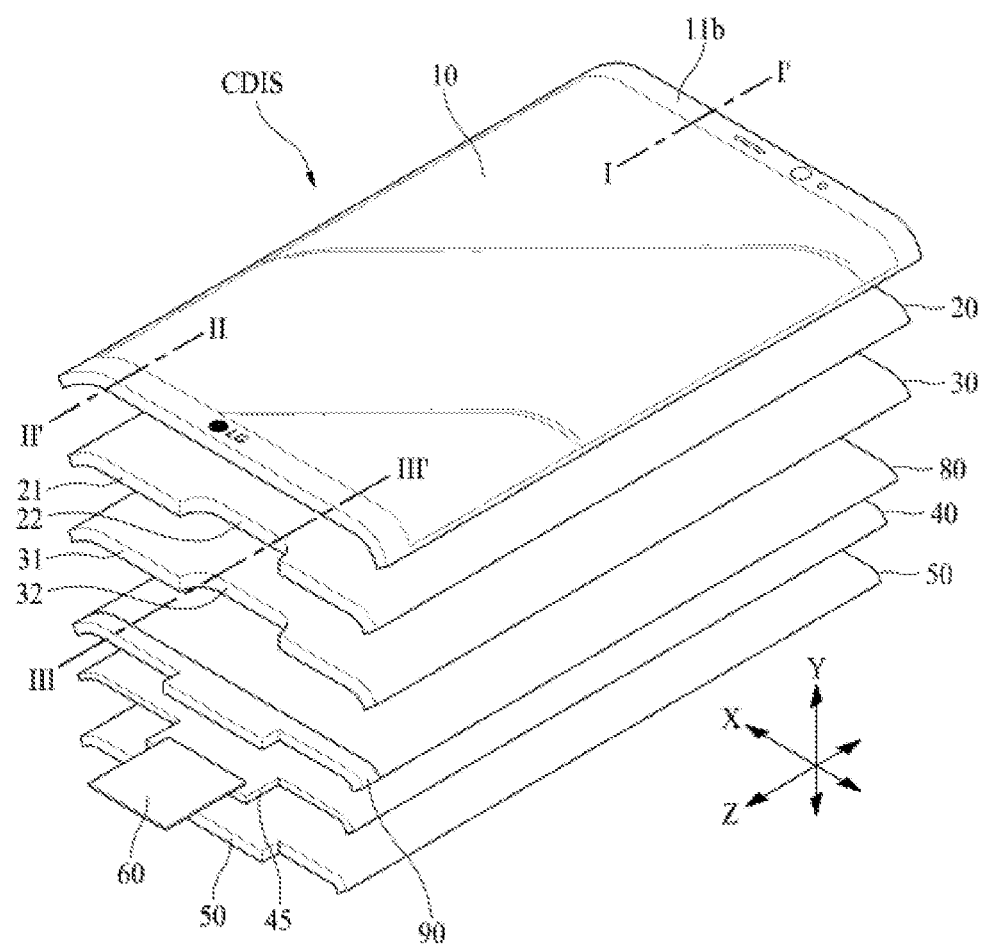
FIG. 11 is an exploded perspective view illustrating the display device according to the second embodiment of the present disclosure.
Figure 12:
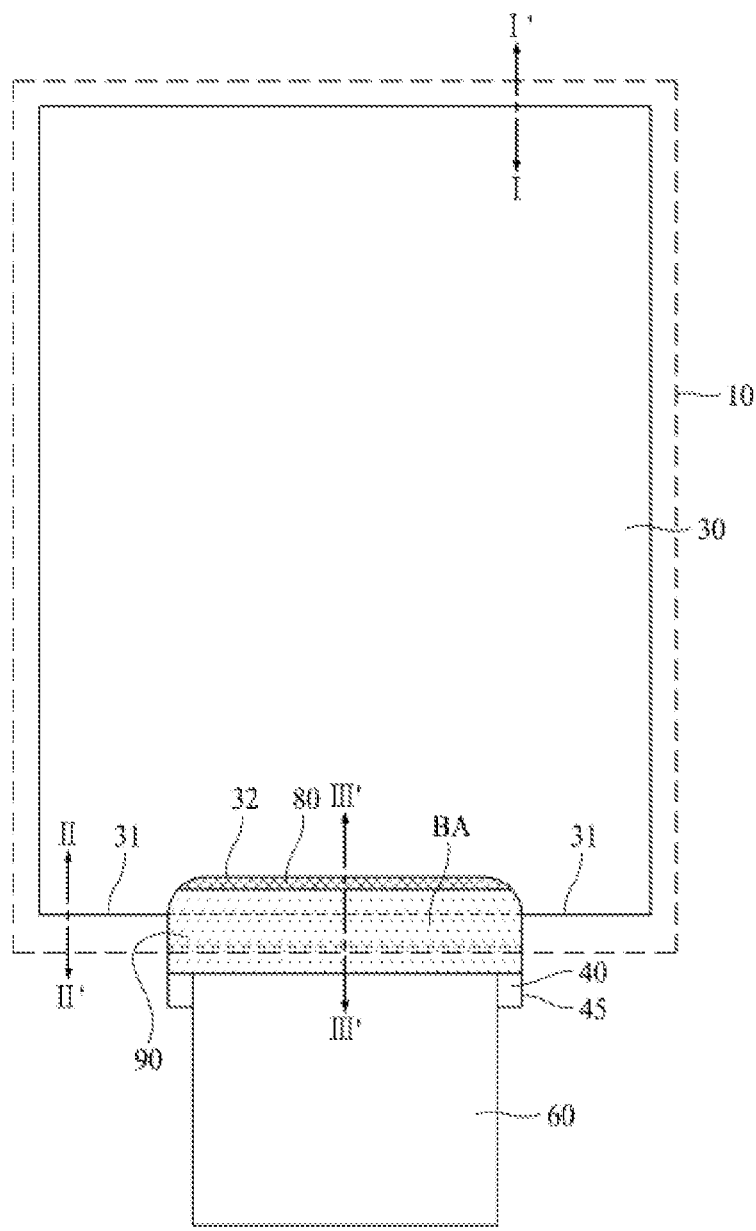
FIG. 12 is a plane view illustrating a polarizing film, a touch film and a display module according to the second embodiment of the present disclosure.
Figure 13:
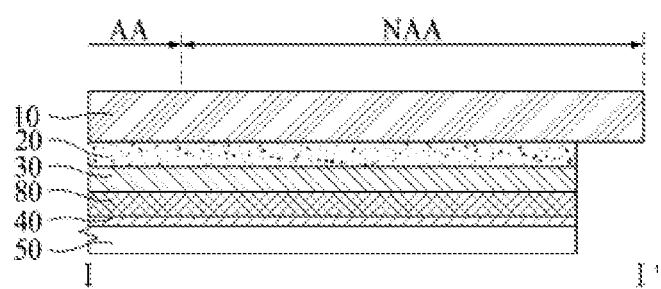
FIG. 13 is a cross sectional view along I-I' of FIG. 12, according to the second embodiment of the present disclosure.
Figure 14:
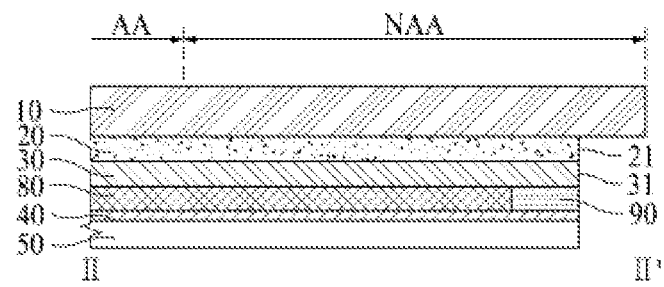
FIG. 14 is a cross sectional view along II-IP of FIG. 12, according to the second embodiment of the present disclosure.
Figure 15A:
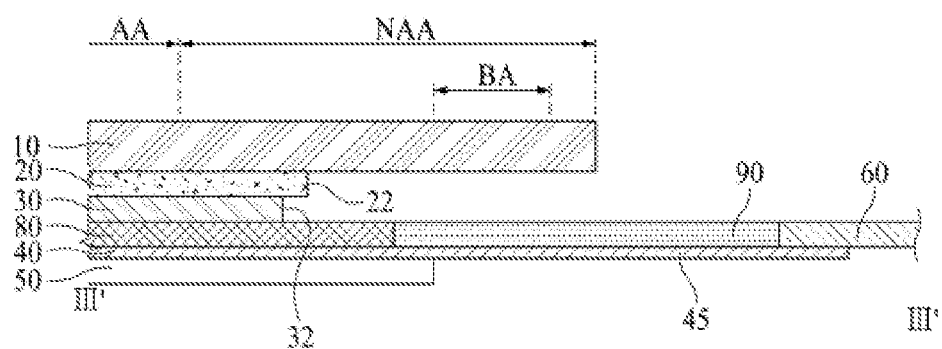
FIG. 15A is a cross sectional view along of FIG. 12, according to the second embodiment of the present disclosure.
Figure 15B:
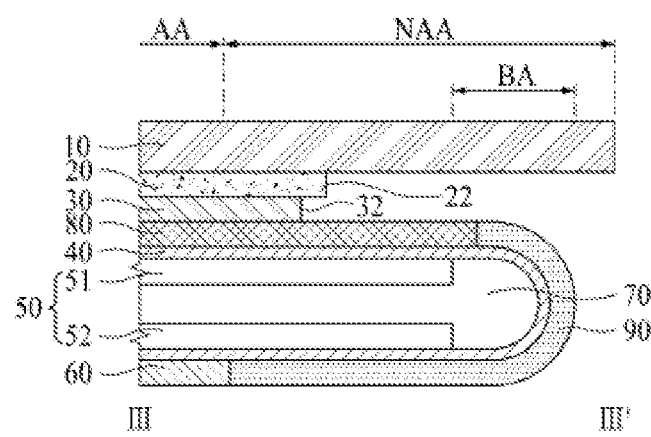
FIG. 15B is a cross sectional view illustrating a bending shape of FIG. 15A, according to the second embodiment of the present disclosure.

FIG. 11 is an exploded perspective view illustrating the display device according to the second embodiment of the present disclosure. FIG. 12 is a plane view illustrating a polarizing film, a touch film and a display module according to the second embodiment of the present disclosure. FIG. 13 is a cross sectional view along I-I' of FIG. 12 according to the second embodiment of the present disclosure. FIG. 14 is a cross sectional view along II-II' of FIG. 12 according to the second embodiment of the present disclosure. FIG. 15A is a cross sectional view along of FIG. 12 according to the second embodiment of the present disclosure. FIG. 15B is a cross sectional view illustrating a bending shape of FIG. 15A according to the second embodiment of the present disclosure.

Referring to FIGS. 11 to 15, the display device according to the second embodiment of the present disclosure may include the cover substrate 10, the polarizing film 30, the touch film 80, the display module 40 and the heat-dissipation film 50. Furthermore, the display device according to the second embodiment of the present disclosure may include an adhesion layer 20 and a reinforcement layer 90. The cover substrate 10, the polarizing film 30, the display module 40 and the heat-dissipation film 50 shown in FIGS. 11 to 15 are the same as those shown in FIGS. 3 to 9, whereby a detailed description for the cover substrate 10, the polarizing film 30, the display module 40 and the heat-dissipation film 50 will be omitted.

The display module 40 may include a display area (AA) and a non-display area (NAA). The non-display area (NAA) corresponds to the peripheral area of the display area (AA), wherein the non-display area (NAA) may be disposed to surround the upper, left, right and lower sides of the display area (AA). The non-display area (NAA) may include a bending area (BA) disposed in at least one among the upper, left, right and lower sides.

The display module 40 may include a bending portion 45 formed in at least one among the upper, left, right and lower sides. The bending portion 45 is obtained by attaching a source drive IC, which protrudes from one side of a flexible substrate 42, for example, a lower side of the flexible substrate 42, to a flexible film 60 in a chip on film (COF) or chip on plastic (COP) method. As shown in FIG. 15B, the bending portion 45 may include the bending area (BA) so as to dispose the flexible film 60 on the rear surface of the heat-dissipation film 50. FIG. 15B shows one embodiment of a bending shape. Referring to FIG. 15B, the bending portion 45 of the display module 40 is disposed on a first heat-dissipation film 51, and one end of the bending portion 45 is attached to the flexible film 60. The bending portion 45 of the display module 40 may be bent to the rear surface of a second heat-dissipation film 52 along a guide member 70 for guiding the flexible film 60 to the rear surface of the second heat-dissipation film 52.

In FIGS. 11 and 12, the bending portion 45 is formed at the lower side of the display module 40, but not limited to this structure. For convenience of explanation, it is assumed that the bending portion 45 is formed at the lower side of the display module 40.

The reinforcement layer 90 is disposed on the display module 40. The reinforcement layer 90 is disposed while being overlapped with the bending portion 45 so as to prevent cracks in the bending portion 45 of the display module 40. The reinforcement layer 90 may be disposed at the lower side which is provided with the bending portion 45.

The reinforcement layer 90 may be overlapped with a first protruding portion 31 of the polarizing film 30. The end of the reinforcement layer 90 may be identical to the end of the first protruding portion 31 of the polarizing film 30. As a result, the end of the polarizing film 30 may be identical to the end of the reinforcement layer 90 and the display module 40 in the first protruding portion 31. The reinforcement layer 90 is formed on the display panel 40, and then the polarizing film 30 is formed thereon. After that, the reinforcement layer 90 is cut together with the polarizing film 30 and the display module 40 by the use of laser, whereby the end of the reinforcement layer 90 is identical to the end of the polarizing film 30 and the display module 40.

The reinforcement layer 90 and the touch film 80 may be formed in the same layer. The reinforcement layer 90 may be disposed while being not overlapped with the touch film 80, but not limited to this structure. The end of the reinforcement layer 90 may be partially overlapped with the end of the touch film 80 adjacent to the reinforcement layer 90.

The reinforcement layer 90 may be a UV/thermal curing resin layer obtained by coating resin and curing the coated resin with UV rays or heat.

The touch film 80 is disposed on the display module 40. The touch film 80 is disposed while being overlapped with some area of the display module 40. In more detail, the touch film 80 is disposed while being overlapped with the display area (AA) of the display module 40. The touch film 80 is disposed while being overlapped with the display module 40 in the non-display area (NAA) of the remaining sides except the side provided with the bending portion 45 of the display module 40. The touch film 80 may be disposed while being not overlapped with the bending portion 45 of the display module 40.

The end of the touch film 80 may be identical to the end of the display module 40 in the non-display area (NAA) of the remaining sides except the side with the bending portion 45 of the display module 40. For example, as shown in FIG. 13, the end of the touch film 80 may be identical to the end of the display module 40 in the left, right and upper sides which are not provided with the bending portion 45. The touch film 80 is formed on the display module 40, and the touch film 80 and the display module 40 are cut at the same time by the use of laser, whereby the end of the touch film 80 may be identical to the end of the display module 40.

The polarizing film 30 is disposed on the touch film 80. The polarizing film 30 is disposed while being overlapped with some area of the display module 40. In more detail, the polarizing film 30 is overlapped with the display area (AA) of the display module 40, to thereby prevent lowering of visibility caused by a reflection of ambient light. The polarizing film 30 is disposed while being overlapped with the display module 40 in the non-display area (NAA) of the remaining sides of the display module 40 except the side with the bending portion 45 of the display module 40. The polarizing film 30 may be disposed while being not overlapped with the bending portion 45 of the display module 40.

The end of the polarizing film 30 may be identical to the end of at least one of the display module 40, the touch film 80 and the reinforcement film 90 in the non-display area (NAA) of the remaining sides except the side with the bending portion 45 of the display module 40. For example, as shown in FIG. 13, the end of the polarizing film 30 may be identical to the end of the display module 40 and the touch film 80 in the left, right and upper sides of the display module 40.

Meanwhile, the polarizing film 30 may include a first protruding portion 31 and a first recess portion 32 disposed at the lower side, that is, the side with the bending portion 45 of the display module 40. The first recess portion 32 exposes the bending portion 45 of the display module 40, and the first recess portion 32 is provided at a first distance from the bending portion 45 of the display module 40. The first protruding portion 31 may protrude so as to cover the reinforcement layer 90 under the circumstances that the first recess portion 32 is provided in-between. The end of the polarizing film 30 may be identical to the end of the reinforcement layer 90 and the display module 40 in the first protruding portion 31. Meanwhile, the end of the polarizing film 30 may be not identical to the end of the display module 40 and the reinforcement layer 90 in the first recess portion 32.

The bending portion 45 of the display module 40 may protrude downwardly from the display module 40, and the bending portion 45 protruding from the display module 40 may be disposed in the area corresponding to the first recess portion 32 of the polarizing film 30.

The first protruding portion 31 of the polarizing film 30 is formed on the touch film 80 and the reinforcement layer 90, and the first protruding portion 31 of the polarizing film 30, the touch film 80 and the reinforcement layer 90 are cut at the same time by the use of laser, whereby the end of the polarizing film 30 may be identical to the end of the touch film 80 and the reinforcement layer 90.

The first recess portion 32 of the polarizing film 30 may be formed to expose some area of the touch film 80 as well as the reinforcement layer 90. If the polarizing film 30 covers the touch film 80, and furthermore, covers some area of the reinforcement layer 90, a pore (or gap) may be generated between the polarizing film 30 and the reinforcement layer 90. Also, if the reinforcement layer 90 overflows into the polarizing film 30, the display module 40 might be bent or damaged due to its thickness difference. In order to prevent this problem, the first recess portion 32 of the polarizing film 30 is formed to expose some area of the touch film 80 as well as the reinforcement layer 90, preferably.

The adhesion layer 20 is disposed on the polarizing film 30. The adhesion layer 20 may be disposed while being overlapped with the polarizing film 30. The adhesion layer 20 may be disposed while being overlapped with some area of the display module 40, for example, the polarizing film 30. In more detail, the adhesion layer 20 may be disposed while being overlapped with the display module 40 in the non-display area (NAA) of the remaining sides except the side with the bending portion 45 of the display module 40. The adhesion layer 20 may be disposed while being not overlapped with the bending portion 45 of the display module 40.

The end of the adhesion layer 20 may be identical to the end of at least one among the display module 40, the touch film 80 and the reinforcement layer 90 in the non-display area (NAA) of the remaining sides except the side with the bending portion 45 of the display module 40. For example, as shown in FIG. 13, each end of the adhesion layer 20 may be identical to the end of the display module 40 and the touch film 80 in the left, right and upper sides of the display module 40.

Meanwhile, the adhesion layer 20 may include a second protruding portion 21 and a second recess portion 22 disposed at the lower side, that is, the side with the bending portion 45 of the display module 40. The second recess portion 22 exposes the bending portion 45 of the display module 40, and the second recess portion 22 is provided at a second distance from the bending portion 45 of the display module 40. The second protruding portion 21 may protrude so as to cover the reinforcement layer 90 under the circumstances that the second recess portion 22 is provided in-between. The end of the adhesion layer 20 may be identical to the end of the polarizing film 30, the display module 40 and the reinforcement layer 90 in the second protruding portion 21. Meanwhile, the end of the adhesion layer 20 may be identical to the end of the polarizing film 30 in the second recess portion 22, but not identical to the end of the display module 40 and the reinforcement layer 90 in the second recess portion 22.

The display device according to the second embodiment of the present disclosure may be embodied in that the end of the polarizing film 30, the touch film 80 and the reinforcement layer 90 is identical to the end of the display module 40 in the non-display area (NAA) at the side which is not provided with the bending portion 45. In the display device according to the second embodiment of the present disclosure, the polarizing film 30, the touch film 80, the reinforcement layer 90 and the display module 40 are cut at the same time by the use of laser, whereby the end of each of the polarizing film 30, the touch film 80 and the reinforcement layer 90 is identical to the end of the display module 40. Accordingly, it is possible to remove the step difference among the polarizing film 30, the touch film 80, the reinforcement layer 90 and the display module 40, and to prevent moisture permeation.

Also, the display device according to the second embodiment of the present disclosure includes the reinforcement layer 90 so that it is possible to prevent cracks in the display module 40 for the bending process.

Also, the display device according to the second embodiment of the present disclosure is embodied in that the end of the reinforcement layer 90 disposed at the side provided with the bending portion 45 is identical to the end of the first protruding portion 31 of the polarizing film 30, and to prevent moisture permeation.

Third Embodiment

Figure 16:
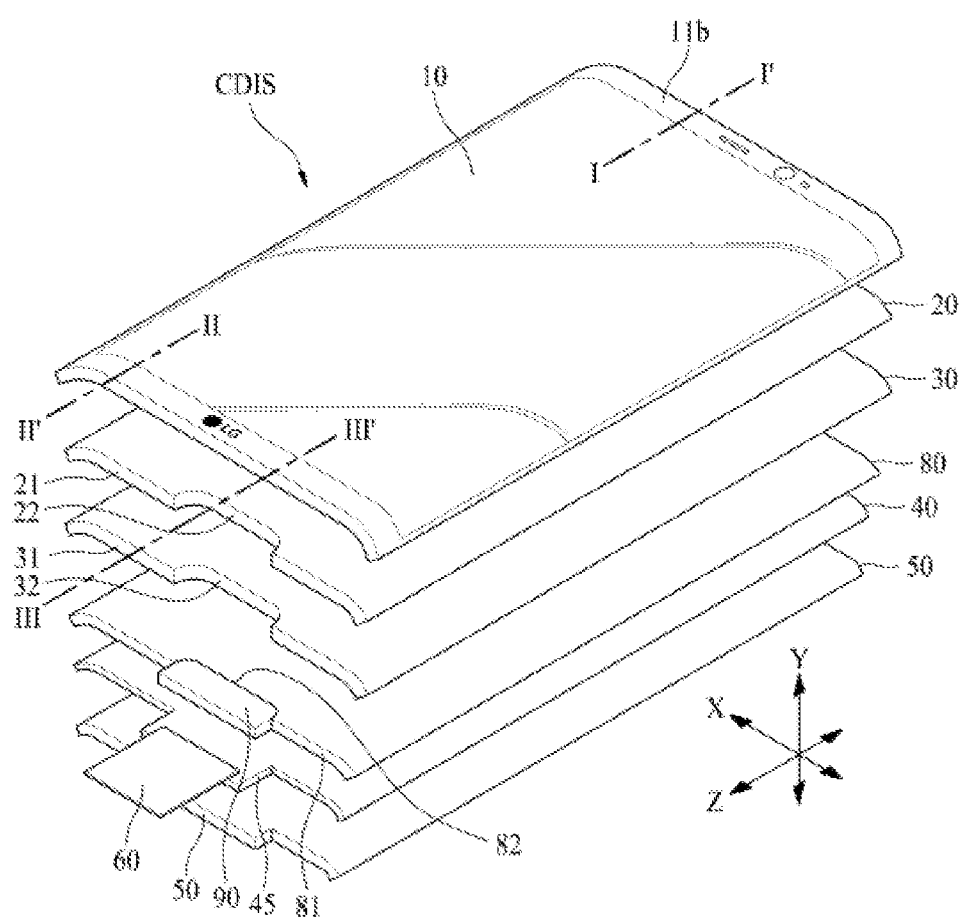
FIG. 16 is an exploded perspective view illustrating a display device according to a third embodiment of the present disclosure.
Figure 17:
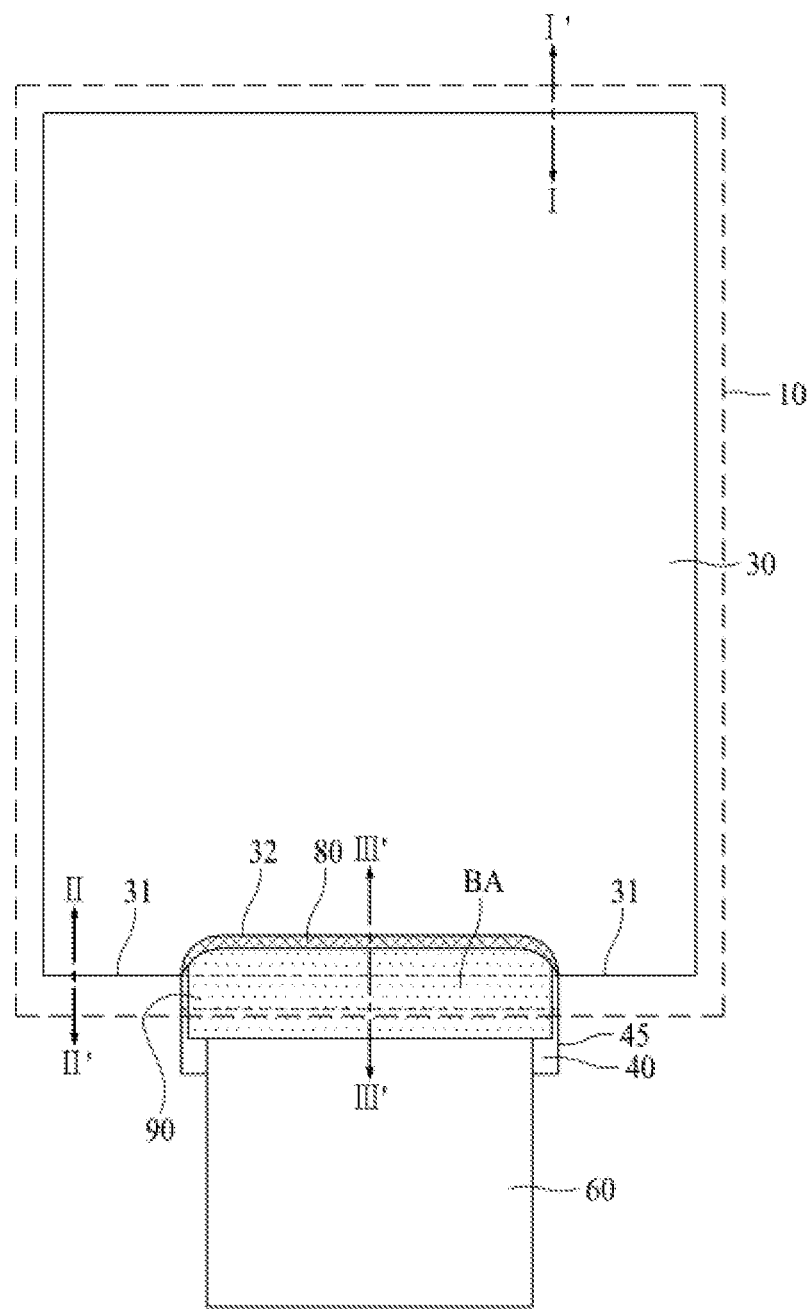
FIG. 17 is a plane view illustrating a polarizing film, a touch film and a display module according to the third embodiment of the present disclosure.
Figure 18:
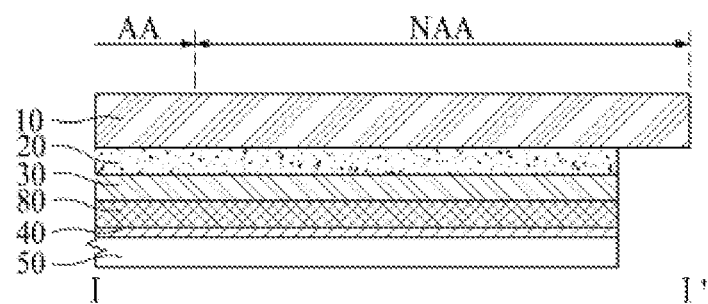
FIG. 18 is a cross sectional view along I-I' of FIG. 17, according to the third embodiment of the present disclosure.
Figure 19:
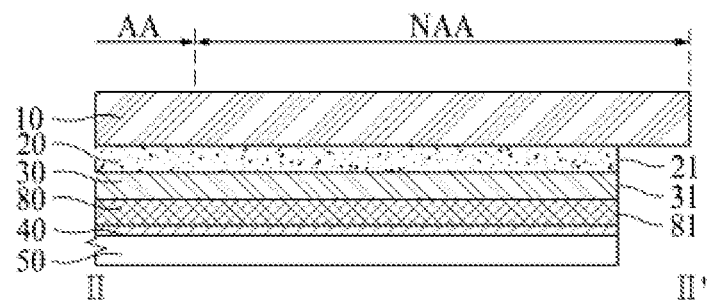
FIG. 19 is a cross sectional view along II-IP of FIG. 17, according to the third embodiment of the present disclosure.
Figures 20A, 20B:
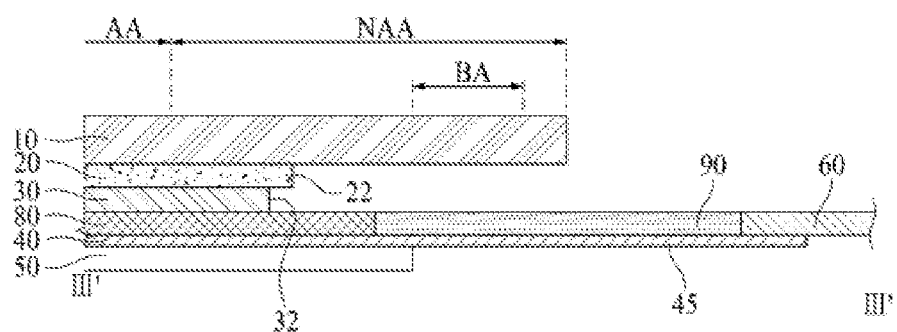
FIG. 20A is a cross sectional view along of FIG. 17, according to the third embodiment of the present disclosure.
FIG. 20B is a cross sectional view illustrating a bending shape of FIG. 20A, according to the third embodiment of the present disclosure.

FIG. 16 is an exploded perspective view illustrating a display device according to the third embodiment of the present disclosure. FIG. 17 is a plane view illustrating a polarizing film, a touch film and a display module according to the third embodiment of the present disclosure. FIG. 18 is a cross sectional view along I-I' of FIG. 17 according to the third embodiment of the present disclosure. FIG. 19 is a cross sectional view along II-II' of FIG. 17 according to the third embodiment of the present disclosure. FIG. 20A is a cross sectional view along of FIG. 17. FIG. 20B is a cross sectional view illustrating a bending shape of FIG. 20A according to the third embodiment of the present disclosure.

Referring to FIGS. 16 to 20, the display device according to the third embodiment of the present disclosure may include a cover substrate 10, an adhesion layer 20, a polarizing film 30, a touch film 80, a reinforcement layer 90, a display module 40 and a heat-dissipation film 50. The cover substrate 10, the polarizing film 30, the display module 40 and the heat-dissipation film 50 shown in FIGS. 16 to 20 are the same as those shown in FIGS. 3 to 9, whereby a detailed description for the aforementioned elements will be omitted.

The display module 40 may include a display area (AA) and a non-display area (NAA). The non-display area (NAA) corresponds to the peripheral area of the display area (AA), wherein the non-display area (NAA) may be disposed to surround the upper, left, right and lower sides of the display area (AA). The non-display area (NAA) may include a bending area (BA) disposed in at least one among the upper, left, right and lower sides.

The display module 40 may include a bending portion 45 formed in at least one among the upper, left, right and lower sides. The bending portion 45 is obtained by attaching a source drive IC, which protrudes from one side of a flexible substrate 42, for example, a lower side of the flexible substrate 42, to a flexible film 60 in a chip on film (COF) or chip on plastic (COP) method. As shown in FIG. 20B, the bending portion 45 may include the bending area (BA) so as to dispose the flexible film 60 on the rear surface of the heat-dissipation film 50. FIG. 20B shows one embodiment of a bending shape. Referring to FIG. 20B, the bending portion 45 of the display module 40 is disposed on a first heat-dissipation film 51, and one end of the bending portion 45 is attached to the flexible film 60. The bending portion 45 of the display module 40 may be bent to the rear surface of a second heat-dissipation film 52 along a guide member 70 for guiding the flexible film 60 to the rear surface of the second heat-dissipation film 52.

In FIGS. 16 and 17, the bending portion 45 is formed at the lower side of the display module 40, but not limited to this structure. For convenience of explanation, it is assumed that the bending portion 45 is formed at the lower side of the display module 40.

The reinforcement layer 90 is disposed on the display module 40. The reinforcement layer 90 is disposed while being overlapped with the bending portion 45 so as to prevent cracks in the bending portion 45 of the display module 40. The reinforcement layer 90 may be disposed at the lower side which is provided with the bending portion 45.

The reinforcement layer 90 and the touch film 80 may be formed in the same layer. The reinforcement layer 90 may be disposed while being not overlapped with the touch film 80, but not limited to this structure. The end of the reinforcement layer 90 may be partially overlapped with the end of the touch film 80 adjacent to the reinforcement layer 90.

The reinforcement layer 90 may be a UV/thermal curing resin layer obtained by coating resin and curing the coated resin with UV rays or heat.

The touch film 80 is disposed on the display module 40. The touch film 80 is disposed while being overlapped with some area of the display module 40. In more detail, the touch film 80 is disposed while being overlapped with the display area (AA) of the display module 40. The touch film 80 is disposed while being overlapped with the display module 40 in the non-display area (NAA) of the remaining sides except the side provided with the bending portion 45 of the display module 40. The touch film 80 may be disposed while being not overlapped with the bending portion 45 of the display module 40.

The end of the touch film 80 may be identical to the end of the display module 40 in the non-display area (NAA) of the remaining sides except the side with the bending portion 45 of the display module 40. For example, as shown in FIG. 18, the end of the touch film 80 may be identical to the end of the display module 40 in the left, right and upper sides which are not provided with the bending portion 45.

Meanwhile, the touch film 80 may include a third protruding portion 81 (e.g., a third edge) and a third recess portion 82 disposed at the lower side, that is, the side with the bending portion 45. The third recess portion 82 exposes the bending portion 45 of the display module 40, and the third recess portion 82 is provided at a third distance from the bending portion 45 of the display module 40. The third protruding portion 81 may protrude so as to cover the display module 40 under the circumstances that the third recess portion 82 is provided in-between. The end of the touch film 80 may be identical to the end of the display module 40 in the third protruding portion 81. Meanwhile, the end of the touch film 80 may be not identical to the end of the display module 40 in the third recess portion 82.

The touch film 80 is formed on the display module 40, and the touch film 80 and the display module 40 are cut at the same time by the use of laser, whereby the end of the touch film 80 may be identical to the end of the display module 40.

The polarizing film 30 is disposed on the touch film 80. The polarizing film 30 is disposed while being overlapped with some area of the display module 40. In detail, the polarizing film 30 is overlapped with the display area (AA) of the display module 40, to thereby prevent lowering of visibility caused by a reflection of ambient light. The polarizing film 30 is disposed while being overlapped with the display module 40 in the non-display area (NAA) of the other sides of the display module 40 except the side with the bending portion 45 of the display module 40. The polarizing film 30 may be disposed while being not overlapped with the bending portion 45 of the display module 40.

The end of the polarizing film 30 may be identical to the end of the display module 40 and the touch film 80 in the non-display area (NAA) of the remaining sides except the side with the bending portion 45 of the display module 40. For example, as shown in FIG. 18, the end of the polarizing film 30 may be identical to the end of the display module 40 and the touch film 80 in the left, right and upper sides of the display module 40.

Meanwhile, the polarizing film 30 may include a first protruding portion 31 and a first recess portion 32 disposed at the lower side, that is, the side with the bending portion 45 of the display module 40. The first recess portion 32 exposes the bending portion 45 of the display module 40, and the first recess portion 32 is provided at a first distance from the bending portion 45 of the display module 40. The first protruding portion 31 may protrude so as to cover the touch film 80 under the circumstances that the first recess portion 32 is provided in-between. The end of the polarizing film 30 may be identical to the end of the display module 40 and the touch film 80 in the first protruding portion 31. Meanwhile, the end of the polarizing film 30 may be not identical to the end of the display module 40 and the touch film 80 in the first recess portion 32.

The bending portion 45 of the display module 40 may protrude downwardly from the display module 40, and the bending portion 45 protruding from the display module 40 may be disposed in the area corresponding to the first recess portion 32 of the polarizing film 30.

The first protruding portion 31 of the polarizing film 30 is formed on the touch film 80, and the first protruding portion 31 of the polarizing film 30 and the touch film 80 are cut at the same time by the use of laser, whereby the end of the polarizing film 30 may be identical to the end of the display module 40 and the touch film 80.

The first recess portion 32 of the polarizing film 30 may be formed to expose some area of the touch film 80 as well as the reinforcement layer 90. If the polarizing film 30 covers the touch film 80, and furthermore, covers some area of the reinforcement layer 90, a pore may be generated between the polarizing film 30 and the reinforcement layer 90. Also, if the reinforcement layer 90 overflows into the polarizing film 30, the display module 40 might be bent or damaged due to its thickness difference. In order to prevent this problem, the first recess portion 32 of the polarizing film 30 is formed to expose some area of the touch film 80 as well as the reinforcement layer 90, preferably.

The adhesion layer 20 is disposed on the polarizing film 30. The adhesion layer 20 may be disposed while being overlapped with the polarizing film 30. The adhesion layer 20 may be disposed while being overlapped with some area of the display module 40, for example, the polarizing film 30. In more detail, the adhesion layer 20 may be disposed while being overlapped with the display module 40 in the non-display area (NAA) of the remaining sides except the side with the bending portion 45 of the display module 40. The adhesion layer 20 may be disposed while being not overlapped with the bending portion 45 of the display module 40.

The end of the adhesion layer 20 may be identical to the end of the display module 40 and the touch film 80 in the non-display area (NAA) of the remaining sides except the side with the bending portion 45 of the display module 40. In more detail, as shown in FIG. 18, the end of the adhesion layer 20 may be identical to the end of the display module 40 and the touch film 80 in the left, right and upper sides.

Meanwhile, the adhesion layer 20 may include a second protruding portion 21 and a second recess portion 22 disposed at the lower side, that is, the side with the bending portion 45 of the display module 40. The second recess portion 22 exposes the bending portion 45 of the display module 40, and the second recess portion 22 is provided at a second distance from the bending portion 45 of the display module 40. The second protruding portion 21 may protrude so as to cover the touch film 80 under the circumstances that the second recess portion 22 is provided in-between. The end of the adhesion layer 20 may be identical to the end of the polarizing film 30, the display module 40 and the touch film 80 in the second protruding portion 21. Meanwhile, the end of the adhesion layer 20 may be identical to the end of the polarizing film 30 in the second recess portion 22, but not identical to the end of the touch film 80 and the display module 40 in the second recess portion 22.

The display device according to the third embodiment of the present disclosure may be embodied in that the end of the polarizing film 30 and the touch film 80 is identical to the end of the display module 40 in the non-display area (NAA) at the side which is not provided with the bending portion 45. In the display device according to the third embodiment of the present disclosure, the polarizing film 30, the touch film 80 and the display module 40 are cut at the same time by the use of laser, whereby the end of each of the polarizing film 30 and the touch film 80 is identical to the end of the display module 40. Accordingly, it is possible to remove the step difference among the polarizing film 30, the touch film 80 and the display module 40, and to prevent moisture permeation.

Also, the display device according to the third embodiment of the present disclosure is embodied in that the end of the touch film 80 disposed at the side provided with the bending portion 45 is identical to the end of the first protruding portion 31 of the polarizing film 30, and to prevent moisture permeation.

According to one or more embodiments of the present disclosure, a display device comprises a display module including a display area for displaying an image and a non-display area, wherein a bending portion including a bending area is formed in the non-display area, and a polarizing film including a first recess portion, wherein the polarizing film is disposed on the display module, and the first recess portion, which exposes the bending portion of the display module, is provided at a first distance from the bending portion of the display module.

According to one or more embodiments of the present disclosure, the polarizing film further includes a first protruding portion which protrudes under the circumstances that the first recess portion is disposed in-between.

According to one or more embodiments of the present disclosure, the end of the polarizing film is identical to the end of the display module in the first protruding portion.

According to one or more embodiments of the present disclosure, the end of the polarizing film is identical to the end of the display module in the remaining sides except a first side provided with the bending portion.

According to one or more embodiments of the present disclosure, the display device further includes a cover substrate disposed on the polarizing film, and an adhesion layer including a second recess portion, wherein the adhesion layer is disposed between the polarizing film and the cover substrate, and the second recess portion, which exposes the bending portion of the display module, is provided at a second distance from the bending portion of the display module.

According to one or more embodiments of the present disclosure, the adhesion layer further includes a second protruding portion which protrudes under the circumstances that the second recess portion is disposed in-between.

According to one or more embodiments of the present disclosure, the end of the adhesion layer is identical to the end of each of the display module and the polarizing film in the second protruding portion.

According to one or more embodiments of the present disclosure, the display device further includes a touch film disposed between the display module and the polarizing film and provided with a third recess portion, wherein the third recess portion, which exposes the bending portion of the display module, is provided at a third distance from the bending portion of the display module.

According to one or more embodiments of the present disclosure, the end of the touch film is identical to the end of each of the display module and the polarizing film in the remaining sides except a first side provided with the bending portion.

According to one or more embodiments of the present disclosure, the touch film further includes a third protruding portion which protrudes under the circumstances that the third recess portion is disposed in-between.

According to one or more embodiments of the present disclosure, the end of the touch film is identical to the end of each of the display module and the polarizing film in the third protruding portion.

According to one or more embodiments of the present disclosure, the display device further includes a touch film disposed between the display module and the polarizing film, and a reinforcement layer disposed in the same layer as the touch film, and overlapped with the bending portion of the display module.

According to one or more embodiments of the present disclosure, the end of the reinforcement layer is identical to the end of the first protruding portion of the polarizing film.

According to one or more embodiments of the present disclosure, the display device further includes a heat-dissipation film disposed on a rear surface of the display module, wherein the end of the heat-dissipation film is identical to the end of the first protruding portion of the polarizing film.

According to one or more embodiments of the present disclosure, a display device comprises a display module including a display area for displaying an image and a non-display area, wherein a bending portion including a bending area is formed in the non-display area, and a polarizing film disposed on the display module and configured to expose the bending portion of the display module, wherein the end of the polarizing film is identical to the end of the display module in the non-display area of the remaining sides except a first side provided with the bending portion.

According to one or more embodiments of the present disclosure, the polarizing film includes a first recess portion configured to expose the bending portion of the display module and provided at a first distance from the bending portion of the display module, and a first protruding portion which protrudes under the circumstances that the first recess portion is disposed in-between.

According to one or more embodiments of the present disclosure, the end of the polarizing film is identical to the end of the display module in the first protruding portion.

According to one or more embodiments of the present disclosure, the display device further includes a cover substrate disposed on the polarizing film, and an adhesion layer disposed between the polarizing film and the cover substrate and configured to expose the bending portion of the display module, wherein the end of the adhesion layer is identical to the end of the display module in the non-display area of the remaining sides except the first side provided with the bending portion.

According to one or more embodiments of the present disclosure, the display device further includes a touch film disposed between the display module and the polarizing film and configured to expose the bending portion of the display module, wherein the end of the touch film is identical to the end of the display module in the non-display area of the remaining sides except the first side provided with the bending portion.

According to one or more embodiments of the present disclosure, the touch film includes a third recess portion configured to expose the bending portion of the display module and provided at a third distance from the bending portion of the display module, and a third protruding portion which protrudes under the circumstances that the third recess portion is disposed in-between.

According to one or more embodiments of the present disclosure, the end of the touch film is identical to the end of each of the display module and the polarizing film in the third protruding portion.

According to one or more embodiments of the present disclosure, the bending portion of the display module protrudes from the display module.

According to one or more embodiments of the present disclosure, the bending portion protruding from the display module is disposed in the area corresponding to the first recess portion of the polarizing film.

In the display device according to the embodiment of the present disclosure, the end of the polarizing film is identical to the end of the display module in the non-display area of the side which is not provided with the bending portion so that it is possible to prevent the step difference between the polarizing film and the display module, to thereby prevent moisture permeation.

Also, the end of the adhesion layer is identical to the end of the polarizing film in the non-display area of the side which is not provided with the bending portion so that it is possible to prevent the step difference between the adhesion layer and the polarizing film, to thereby prevent moisture permeation.

Also, the end of each of the touch film and the polarizing film is identical to the end of the display module in the non-display area of the side which is not provided with the bending portion so that it is possible to prevent the step difference between the touch film/polarizing film and the display module, to thereby prevent moisture permeation.

Also, the polarizing film may include the recess portion and the protruding portion disposed in the side with the bending portion, wherein the recess portion is provided at a predetermined distance from the bending portion, and the protruding portion protrudes under the circumstances that the recess portion is disposed in-between. In this case, the end of the protruding portion of the polarizing film is identical to the end of the display module so that it is possible to prevent the step difference between the polarizing film and the display module in the side provided with the bending portion.

Also, the end of each of the polarizing film, the touch film and the reinforcement layer is identical to the end of the display module so that it is possible to prevent the step difference there among, and furthermore, to prevent moisture permeation.

Also, the display device according to the embodiment of the present disclosure includes the reinforcement layer so that it is possible to prevent cracks in the display module for the bending process.

Also, the end of the reinforcement layer disposed in the side provided with the bending portion is identical to the end of the protruding portion of the polarizing film so that it is possible to prevent moisture permeation caused by the step difference there between.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
   a display module including a display area for displaying an image, a non-display area that does not display the image, and a bending portion in the non-display area, the bending portion of the display module including a bending area (BA) so as to dispose a flexible film over a rear surface of the display module;
   a polarizing film disposed on the display module, the polarizing film including a first recess portion at a first side of the polarizing film, the first recess portion indented away from the first side of the polarizing film towards the display area and non-overlapping with the bending area of the bending portion of the display module to expose the bending area of the bending portion of the display module;
   a cover substrate disposed on the polarizing film; and
   an adhesion layer including a second recess portion at a first side of the adhesion layer, wherein the adhesion layer is disposed between the polarizing film and the cover substrate, and the second recess portion is indented away from the first side of the adhesion layer towards the display area and non-overlapping with the bending area of the bending portion of the display module to expose the bending area of the bending portion of the display module.

2. The display device according to claim 1, wherein the first side of the polarizing film further includes a first edge that extends from the first recess portion at the first side of the polarizing film, the first edge of the polarizing film aligned with a side of the display module.

3. The display device according to claim 2, further comprising:
   a touch film disposed between the display module and the polarizing film; and
   a reinforcement layer disposed in a same layer as the touch film, a first side of the reinforcement layer overlapping at least a portion of the bending portion of the display module.

4. The display device according to claim 2, further comprising:
   a heat-dissipation film disposed under the display module, wherein a first side of the heat-dissipation film is aligned with an edge of the polarizing film.

5. The display device according to claim 1, wherein the polarizing film further comprises a plurality of sides in addition to the first side, each of the plurality of sides aligned with a corresponding one side of the display module except for a side of the display module that comprises the bending portion.

6. The display device according to claim 1, wherein the adhesion layer further includes a second edge that extends from the second recess portion at the first side of the adhesion layer, the second edge of the adhesion layer aligned with the side of the display device that is aligned with an edge on the first side of the polarizing film.

7. The display device according to claim 1, further comprising a touch film disposed between the display module and the polarizing film and provided with a third recess portion at a first side of the touch film, wherein the third recess portion indents away from the first side of the touch film towards the display area and is non-overlapping with the bending area of the bending portion of the display module to expose the bending area of the bending portion of the display module.

8. The display device according to claim 7, wherein the touch film further comprises a plurality of sides in addition to the first side, each of the plurality of sides of the touch film aligned with a corresponding one side of the display module except for a side of the display module that comprises the bending portion.

9. The display device according to claim 7, wherein the touch film further includes a third edge that extends from the third recess portion at the first side of the touch film, the third edge of the touch film aligned with the side of the display module that is aligned with an edge on the first side of the polarizing film.

10. A display device comprising:
    a display module including a display area for displaying an image, a non-display area, and a bending portion in the non-display area at a side of the display module, the bending portion of the display module and including a bending area (BA) so as to dispose a flexible film over a rear surface of the display module;
    a polarizing film disposed on the display module and configured to expose the bending area of the bending portion of the display module, the polarizing film comprising a plurality of sides that are each aligned with a corresponding side of the display module except for the side of the display module that includes the bending portion, the polarizing film including a first recess portion on a first side of the plurality of sides of the polarizing film, the first recess portion configured to expose the bending portion of the display module;

a cover substrate disposed on the polarizing film; and an adhesion layer including a second recess portion at a first side of the adhesion layer, wherein the adhesion layer is disposed between the polarizing film and the cover substrate, and the second recess portion is indented away from the first side of the adhesion layer towards the display area and non-overlapping with the bending area of the bending portion of the display module to expose the bending area of the bending portion of the display module.

11. The display device according to claim 10, wherein the first recess portion is indented away from the first side of the polarizing film toward the display area and non-overlapping with the bending area of the bending portion of the display module to expose the bending area of the bending portion of the display module.

12. The display device according to claim 10, further comprising a touch film disposed between the display module and the polarizing film, the touch film further comprising a third recess portion on a first side of the touch film, the third recess portion indented away from the first side of the touch film towards the display area and non-overlapping with the bending area of the bending portion of the display module to expose the bending area of the bending portion of the display module.

13. The display device according to claim 12, wherein the touch film further includes an edge that extends from the third recess portion, the edge of the touch film aligned with the side of the display module and one of the plurality of sides of the polarizing film.

14. The display device according to claim 10, wherein the bending portion of the display module protrudes away from a center of the display module.

* * * * *